United States Patent
Adamski

(10) Patent No.: US 9,857,818 B1
(45) Date of Patent: Jan. 2, 2018

(54) BIASING FOR LOWER $R_{ON}$ OF LDO PASS DEVICES

(71) Applicant: Peregrine Semiconductor Croporation, San Diego, CA (US)

(72) Inventor: Jaroslaw Adamski, Steamwood, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 15/451,178

(22) Filed: Mar. 6, 2017

(51) Int. Cl.
- *G05F 1/595* (2006.01)
- *H03F 1/22* (2006.01)
- *H03F 1/02* (2006.01)
- *H03F 3/21* (2006.01)
- *H03F 3/19* (2006.01)

(52) U.S. Cl.
CPC ............ *G05F 1/595* (2013.01); *H03F 1/0233* (2013.01); *H03F 1/223* (2013.01); *H03F 3/19* (2013.01); *H03F 3/21* (2013.01); *H03F 2200/451* (2013.01)

(58) Field of Classification Search
CPC ....................................................... G05F 1/595
USPC ................................................... 323/270, 273
See application file for complete search history.

(56) References Cited

U.S. PATENT DOCUMENTS

| 8,278,893 B2 * | 10/2012 | Motz ....................... G05F 1/575 323/273 |
| 8,330,504 B2 * | 12/2012 | Olson ................... H03K 17/102 326/82 |

OTHER PUBLICATIONS

Adamski, Jaroslaw, "LDO with Fast Recovery from Saturation", patent application filed Jan. 25, 2017, U.S. Appl. No. 15/415,768, 41 pgs.
Kovac, David, Stacked PA Power Control:, patent application filed Mar. 16, 2017, U.S. Appl. No. 15/451,184, 39 pgs.

* cited by examiner

*Primary Examiner* — Jeffrey Sterrett
(74) *Attorney, Agent, or Firm* — Jaquez Land Greenhaus LLP; Martin J. Jaquez, Esq.; Alessandro Steinfl, Esq.

(57) ABSTRACT

Systems, methods and apparatus for efficient control and biasing of pass devices driven into their triode region of operation are described. The pass devices are arranged in a cascode configuration comprising a plurality of stacked devices. Biasing of the cascode devices can be according to a voltage division scheme which provides a substantially equal voltage division across the stacked devices when the voltage across the stack is high, and provides a skewed voltage division across the stacked devices when voltage across the stack is reduced, while protecting each of the devices from overvoltage and biasing the cascoded devices for a low $R_{ON}$. An exemplary implementation of an LDO controlling the pass devices for providing burst RF power to a power amplifier is described.

25 Claims, 12 Drawing Sheets

US 9,857,818 B1

BIASING FOR LOWER $R_{ON}$ OF LDO PASS DEVICES

CROSS-REFERENCE TO RELATED APPLICATIONS

The present application may be related to U.S. patent application Ser. No. 15/415,768, filed on Jan. 25, 2017, entitled "LDO with Fast Recovery from Saturation", the disclosure of which is incorporated herein by reference in its entirety. The present application may also be related to U.S. patent application Ser. No. 15/451,184, filed on even date herewith, entitled "Stacked PA Power Control", the disclosure of which is incorporated herein by reference in its entirety.

TECHNICAL FIELD

The present application generally relates to electronic circuitry, and more specifically to low dropout (LDO) regulators.

BACKGROUND

A low dropout (LDO) regulator can be used to provide regulated power to an electronic device at a level close to a level of a power source provided to the LDO regulator. FIG. 1 shows an exemplary case where an LDO regulator (110) is used to provide power to a radio frequency (RF) power amplifier (150) based on a power source Vbatt. The LDO regulator (110) comprises an operational amplifier (115) whose output is connected to a current driver circuit (120) capable of handling current high enough for operation of the RF power amplifier (150) at a desired output voltage of the LDO regulator, LDO_out. Such output voltage, LDO_out, is sampled through, for example, a voltage division network formed by resistors (R1, R2) and fed back to the positive input terminal of the operational amplifier (115), to create a closed loop control of the output voltage LDO_out such as to track an input voltage fed to the inverting input terminal of the operational amplifier (OpAmp) (115). In the described closed loop mode of operation, the LDO regulator (110) regulates the output voltage LDO_out to remain substantially constant irrespective of the current required by the RF power amplifier during operation.

With further reference to FIG. 1, the current driver circuit (120) can comprise one or more transistor devices, such as P-type MOSFETs (PMOS), which during regulation of the output voltage, LDO_out, operate in their respective saturation regions of operation and can therefore provide a corresponding high enough gain for operation of the above described closed loop control.

As known to a person skilled in the art, transistors of the current driver circuit (120), also referred to as "pass transistors", or "pass devices", can contribute to a power loss, which in some cases may be a disadvantage. Accordingly, it can be desirable to minimize such power loss in the pass devices, which can be achieved by driving the pass devices into their respective triode (linear) regions of operation by applying a corresponding biasing voltage to the gates of the pass devices.

SUMMARY

According to a first aspect of the present disclosure, a circuital arrangement for biasing a cascoded transistor of a stack of transistors arranged in a cascode configuration is presented, the circuital arrangement comprising: a stack of at least two transistors arranged in a cascode configuration, comprising an input transistor and a first cascoded transistor; and a biasing circuit configured to provide a first bias voltage to the first cascoded transistor, wherein: a supply voltage to the stack is a varying supply voltage, and the first bias voltage is at a substantially constant offset voltage with respect to the varying supply voltage.

According to a second aspect of the present disclosure, a method for biasing a stack of transistors is presented, the method comprising: providing a stack of at least two transistors arranged in a cascode configuration, the stack comprising an input transistor and one or more cascoded transistors; supplying a supply voltage across the stack; biasing the one or more cascoded transistors with respective one or more biasing voltages, the respective one or more biasing voltages having each a substantially constant offset voltage with respect to the supply voltage; providing a control voltage to the input transistor; based on the providing of the control voltage, driving the input transistor in its triode region of operation; based on the driving, driving the one or more cascoded transistors in their respective triode regions of operation; based on the biasing, obtaining an ON resistance $R_{ON}$ for each of the one or more cascoded transistors; varying the supply voltage; and based on the varying and the biasing, maintaining the ON resistance $R_{ON}$ of the one or more cascoded transistors.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

Figure 1:
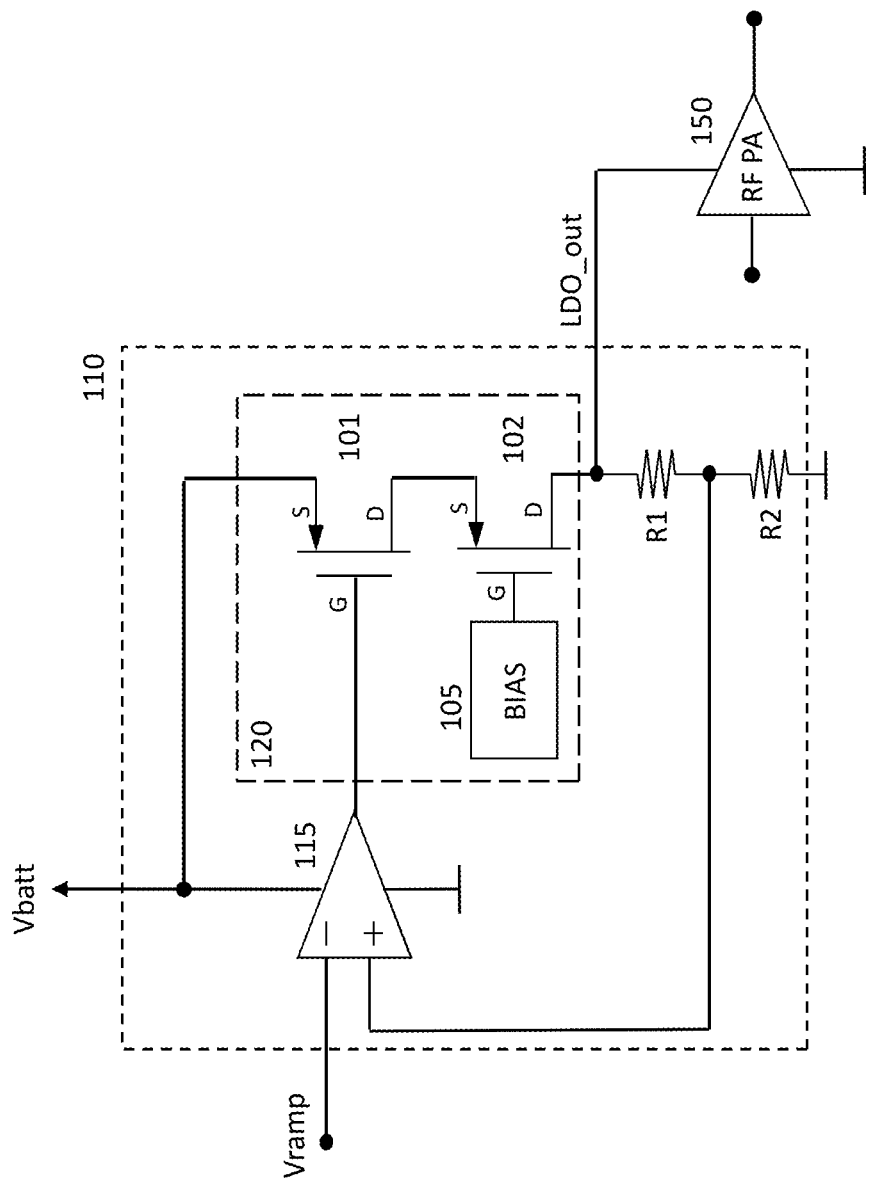
FIG. 1 is a simplified schematic representation of an RF power amplifier whose power is controlled by an LDO regulator. Power to the RF power amplifier is controlled by a control voltage, Vramp, input to a low power amplifier of the LDO regulator, where the LDO regulator outputs a power, based on the Vramp control voltage and a supply voltage (Vbatt).

As shown in FIG. 1, an LDO regulator (110) can be used to control power to an RF power amplifier (RF PA) (150). The LDO regulator comprises a low power OpAmp (115) which drives a high current pass device (101) to provide power to the RF PA (150). An additional second pass device (102) can be used in a cascode configuration to allow for a larger voltage drop across the combination of the pass devices (101, 102), where the larger voltage drop can be substantially equal to the voltage of the supply Vbatt (e.g. nominal supply voltage of 3.5 volts for a handheld cell phone). According to some embodiments the pass devices can be in a cascoded configuration with a dedicated biasing circuit (105) for biasing the additional device.

The person skilled in the art will understand that based on the supply voltage Vbatt, two or more pass devices configured in a series connection as depicted in FIG. 1 may be used as a voltage across the pass devices can be as high as the supply voltage. As known to the person skilled in the art, due to the cascoded configuration of the pass devices (101, 102), biasing of the pass device (102) not driven by the OpAmp (115) is controlled by the pass device (101) in combination with the biasing circuit (105). For the case depicted in FIG. 1 where two pass devices (101, 102) are used, a simple basing circuit (105) (e.g. 405 of FIG. 4, later described) can comprise two resistors configured as a voltage divider network to provide a fixed gate voltage substantially equal to half the supply voltage Vbatt to the gate of the pass device (102). Such simple biasing circuit may inherently impose limits to a biasing voltage for the pass device (102) responsive to a variation of the supply voltage Vbatt, which can therefore limit a low value of an $R_{ON}$ resistance of such pass device. It may therefore be desirable to provide a biasing circuit that biases the pass device (102), or other series connected pass devices not controlled by the OpAmp (115), to achieve a lower $R_{ON}$ for a given pass device size and characteristics.

With further reference to FIG. 1, the RF PA (150) can be used to generate RF power in a GSM system, where the burst of GSM RF power is controlled by the LDO_out voltage that varies between a low voltage corresponding to essentially no power, and a high voltage that corresponds to maximum power. In some exemplary embodiments the LDO_out voltage can vary between 0 volts and 3.4 volts, which in turn can result in an RF output power within a range of approximately [−54, 35] dBm for Low Band GSM operation. It should be noted that the lowest voltage level of the LDO_out voltage combined with the voltage level of the supply voltage Vbatt can determine a minimum number of the cascoded pass transistors necessary to withstand a corresponding voltage drop across such transistors.

The LDO_out voltage that controls the RF power to the RF PA (150) is controlled by the Vramp control voltage fed to the inverting input of the OpAmp (115). In one exemplary embodiment, the Vramp is within a range of [0, 1.6] volts which corresponds to a scale factor of approximately 3.4/1.6 with respect to the LDO_out voltage for a case where the supply voltage Vbatt is 3.4 volts. Such scale factor can be provided by the resistors R1, R2 which divide the LDO_out voltage according to the scaling factor.

Figure 2:
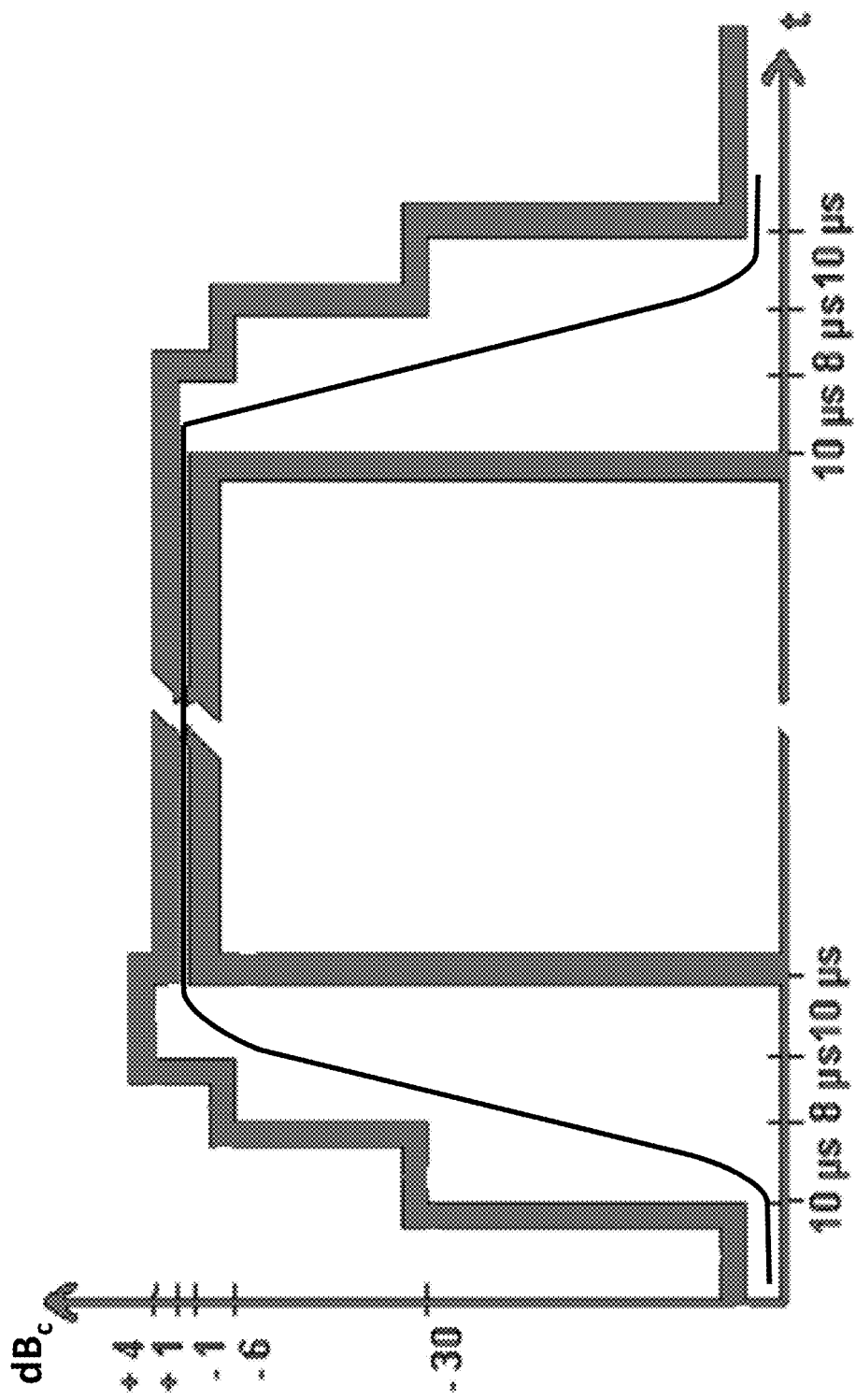
FIG. 2 shows a graph representing a global system for mobiles (GSM) RF burst time mask requirement for generating RF power in a GSM system and an RF power generated according to the mask by way of the RF power amplifier of FIG. 1.

As known to a person skilled in the art, GSM transmission occurs in specific RF bursts that can be controlled by the Vramp signal input to the OpAmp (115). FIG. 2, later discussed, shows a graph representing a GSM RF burst time mask requirement for generating the specific RF bursts. In order to achieve higher efficiency and power, it may be desirable to minimize loss in the pass devices (101, 102) at full power. Such higher efficiency and power can be achieved by driving the pass devices (101, 102) into their respective triode regions of operation in which the pass devices exhibit a very small $R_{ON}$ resistance (between source and drain). According to some embodiments, the size of the pass device (101, 102) is made large enough to reduce the size of the corresponding $R_{ON}$ resistance when operating in the triode region for a lower power consumption of the pass device, and therefore higher operating efficiency and higher power of the RF PA (150). According to an exemplary embodiment, the maximum current at full power drawn by the RF PA (150) from the supply Vbatt can be up to 2 A in which case a target $R_{ON}$ of 100 mΩ or less can be desirable in order to reduce the loss in the pass devices (101, 102) and maximize efficiency of the RF PA (150) at maximum RF power. As known to a person skilled in the art, as size of the pass device (101, 102) increases, so does a corresponding gate-to-source Cgs capacitance. In some embodiments Cgs of the pass device when operating in the triode region of operation can be approximately equal to or larger than 220 pF.

As noted above, the LDO normally operates in a regulated mode, where the output voltage LDO_out follows the input control voltage Vramp according to a closed loop control system defined by the gains of the OpAmp (115), the pass devices (101, 102) operating in the conventional saturation region, and the sampling voltage division network (R1, R2). When under control of the input control voltage Vramp, the OpAmp (115) drives the pass devices (101, 102) into operating in their respective triode regions, gain of the pass devices (101, 102) is drastically reduced, which in turn drastically reduces the gain of the closed loop control system for an effective operation of the LDO in a non-regulated mode, where the LDO_out voltage follows the supply voltage Vbatt with a small drop due to the $R_{ON}$ resistance of the pass devices (101, 102) operating in the triode region.

With continued reference to FIG. 1, the large Cgs capacitance (e.g. ≥220 pF) due to the relatively large size of the pass transistors (101, 102) used to reduce the $R_{ON}$ resistance, can cause a larger charge to accumulate at the gate of the pass devices (101, 102), which in turn can require a larger current for discharging such larger charge in a given amount of time, or alternatively, require a larger time to discharge such larger charge for a given driving current capability. This means that the OpAmp (115), which drives the gate of the pass device (101), needs to either operate at a higher output drive to drive the pass device (101) from one operating region to another in a given amount of time, or to take a longer time to drive the pass device (101) from one operating region to the other.

FIG. 2 shows a graph representing a global system for mobiles (GSM) RF burst time mask requirement for generating RF power in a GSM system and an RF power generated according to the mask by way of the RF power amplifier of FIG. 1 under control of the LDO regulator (110). RF power is generated in bursts that have to meet stringent time mask requirements. According to the time mask requirements, the LDO regulator (110) needs to ramp up the RF PA (150) to full power in approximately 10 to 15 μsec. The same is true for the ramping down of the RF PA (150) to minimum power. As previously notes, the LDO regulator (110) is controlled by the "Vramp" control voltage that is shaped very specifically to enable the RF PA (150) output power to meet the time mask requirements represented in FIG. 2. It should be noted that the power unit in the graph of FIG. 2 is indicated in decibels relative to a carrier, dBc, and that ruptured lines in the timescale are used to mainly highlight regions of interest of the time mask requirement, namely the leading/trailing edges.

Figure 3:
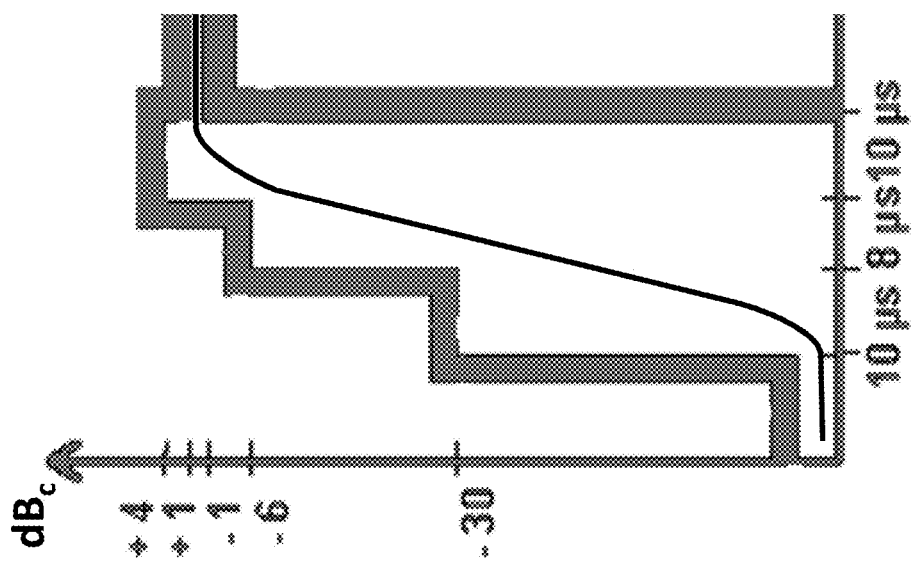
FIG. 3 shows a leading edge portion of the graph represented in FIG. 2.

FIG. 3 shows a leading edge portion of the graph represented in FIG. 2. When working at maximum power, the OpAmp (115) drives the pass device (101) into its triode region of operation to achieve low $R_{ON}$ resistance. This requires charging the Cgs capacitance of the pass device (101) to close to the maximum gate-to-source voltage Vgs allowed for that device, which according to an exemplary embodiment of the present disclosure can be around 2.5V. As can be seen with the graph of FIG. 3, the resulting Cgs charging profile naturally aligns with the requirements of the mask, smoothly ramping the RF power to maximum. Such smooth ramping of the RF power to maximum is desired as it avoids overshoots and meets the time masks requirements and reduces RF switching transients.

With further reference to FIG. 1, according to an exemplary embodiment of the present disclosure, scaling of the LDO_out voltage is established according to a voltage range of the Vbatt supply voltage and a desired voltage range of the Vramp control voltage. For example, assuming Vbatt has an operating range between [3.45, 3.60] volts and the Vramp control voltage has an operating range of [0, 1.60] volts, then according to one exemplary embodiment the scaling factor can be chosen to be 3.4/1.6. A person skilled in the art readily understands that as the supply voltage Vbatt decreases (e.g. battery discharges), LDO_out voltage is not able to follow the Vramp control voltage according to the scaling factor when full power is requested (Vramp=1.6 V); accordingly the OpAmp overdrives the gate of the pass device (101) to obtain the desired LDO_out voltage causing the pass device to transition into its triode region of operation. As related to the battery voltage, a person skilled in the art would know that a battery voltage for a handheld device may be, for example, as low as 3.1 volts when the battery is discharged, and, for example, as high as 4.6 volts when the battery is connected to a charger.

Figure 4:
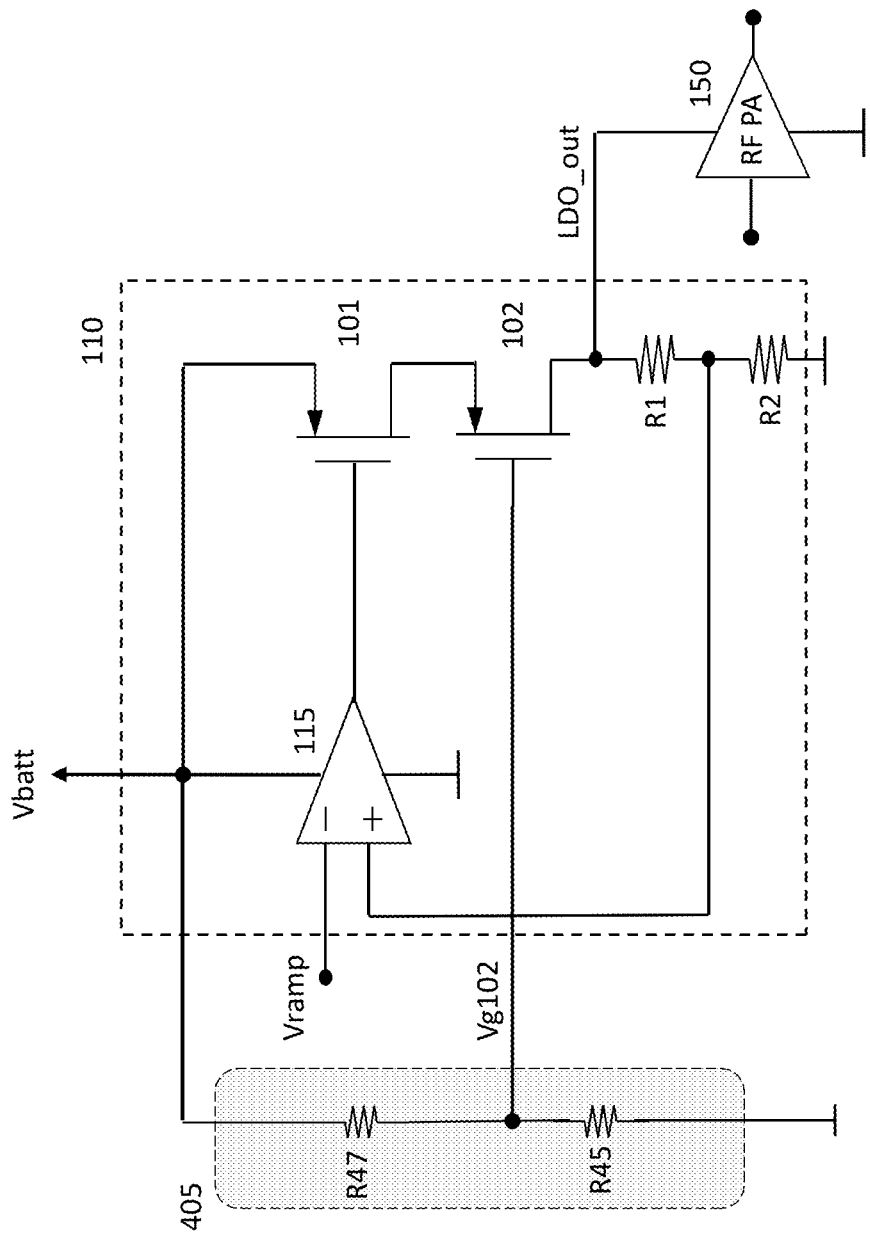
FIG. 4 is a simplified schematic representation of the LDO regulator of FIG. 1, where a biasing circuit according to an embodiment of the present disclosure is provided by a simple resistive voltage divider network.

As discussed above and depicted in FIG. 4, biasing of a pass device (e.g. 102) not driven by the OpAmp (115) can be provided by a simple voltage divider resistor network (R45, R47) that generate a gate biasing voltage Vg102 based on the supply voltage Vbatt. As can be seen in FIG. 4, an output node of the differential OpAmp (115) drives the gate of the pass device (101) which in turn controls the current through the second pass device (102), where the devices (101, 102) are cascoded. In the exemplary implementation depicted in FIG. 4, biasing voltage to the gate of the second pass device (102) is provided by a biasing circuit (405) that includes a voltage divider resistor network (R45, R47) coupled to the supply voltage Vbatt. A person skilled in the art readily understands the principle of operation of the cascoded pass devices (101, 102) and will know of other biasing methods for the gate of the pass device (102). As previously discussed, one or more pass devices in a cascoded configuration can be used with the circuit depicted in FIG. 4, as the number of cascoded devices can be dependent on a desired maximum voltage drop across the pass devices during operation of the circuit. Such maximum voltage drop can be a function of the supply voltage Vbatt, as generally LDO_out can vary between 0 volts and a voltage close to Vbatt. Furthermore, a person skilled in the art would understand that the such simple biasing circuit (405) may inherently impose limits to a biasing voltage for the pass device (102) responsive to a variation of the supply voltage Vbatt, which can therefore limit a low value of an $R_{ON}$ resistance of such pass device. Effectively, the biasing circuit (405) of FIG. 4 can only generate a positive gate biasing voltage Vg102, and therefore, may prevent a lower value of the $R_{ON}$ resistance of the pass device (102), as provided, for example, by a negative gate biasing voltage. It may therefore be desirable to provide a biasing circuit that biases the pass device (102), or other series connected pass devices not controlled by the OpAmp (115), to achieve a lower $R_{ON}$ for a given pass device size and characteristics. According to some embodiments of the present disclosure, such lower $R_{ON}$, may be achieved via negative gate biasing voltages to pass transistors not directly driven by the OpAmp (115).

With further reference to FIG. 4, as noted earlier in the present disclosure, the biasing circuit (405) is adapted to provide a biasing voltage to the gate of the second pass device (102). The simple biasing circuit (405) can provide a fixed gate voltage substantially equal to half the supply voltage Vbatt to the gate of the pass device (102). Such simple gate biasing circuit can provide a substantially equal voltage division (of the supply voltage Vbatt) across the pass devices which results in operation of the pass devices in their safe regions of operation. This means, for a case where the output voltage LDO_out is at its low level, such as, for example, 0 V, the two pass devices (101, 102) each see a voltage substantially equal to half the supply voltage Vbatt across their respective drain and source terminals. As the supply voltage Vbatt decreases, the linear transformation provided by the voltage divider network of the simple biasing circuit (405) maintains the substantially equal voltage division of the supply voltage Vbatt across the pass devices (101, 102). A person skilled in the art readily understands that when operating in its triode region of operation, the $R_{ON}$ of the second pass device (102) increases with a decrease of its gate voltage (e.g. gate to source). Therefore, in a case where the biasing circuit (105) is a simple voltage divider network, as the supply voltage Vbatt decreases, the $R_{ON}$ of the second pass device (102) increases for a decrease in efficiency of operation of the LDO regulator (110).

With continued reference to the simple biasing circuit (405) shown in FIG. 4, it should be noted that as the supply voltage Vbatt decreases, increased freedom in biasing of the pass devices, as measured by a skewing of the voltage division (e.g. providing an unequal voltage division) across the two pass devices (101, 102), is provided, as a lesser voltage needs to be divided across the two pass devices (101,102). It follows that according to an embodiment of the present disclosure, a biasing circuit for basing the second pass device (102) is provided, the biasing circuit being configured to properly divide the supply voltage Vbatt across the pass devices (101, 102), while providing a skewed voltage division across such pass devices when the supply voltage Vbatt is below its high voltage level (e.g. 4.6 V). This allows reducing the $R_{ON}$ of the second pass device (102) while protecting both transistors from operating outside their respective safe regions of operation. It should be noted that although the various MOSFETs shown in the various figures of the present disclosure are each represented by three terminals, other configuration using four-terminal MOSFET devices, where a fourth terminal is representative of a body terminal of the MOSFET device, are also possible. Therefore, depiction of the three-terminal devices in the figures should not be considered as limiting the scope of the present disclosure, as alternative embodiments based on the present embodiments, using four-terminal MOSFETs and/or a combination of three-terminal and four-terminal MOSFETs are within the reach of a person skilled in the art.

Figure 5:
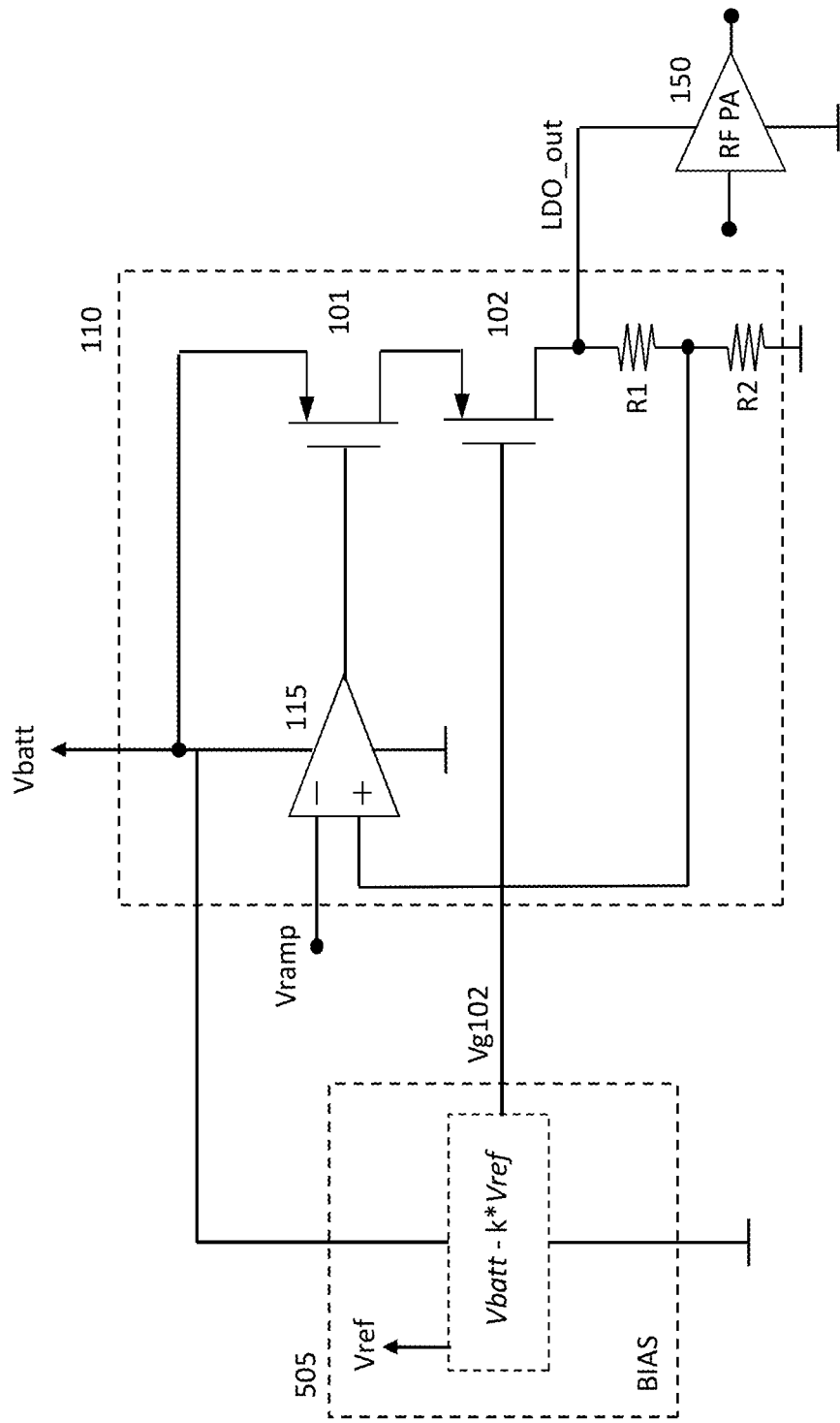
FIG. 5 is a simplified schematic representation of the LDO regulator of FIG. 1, where a biasing circuit according to an embodiment of the present disclosure provides a biasing voltage with a constant offset voltage with respect to a varying supply voltage.

FIG. 5 shows an exemplary biasing circuit (505) which is configured to provide a biasing voltage, vg102, to the gate of the second pass transistor (102). According to an embodiment of the present disclosure, the biasing voltage vg102 generated by the biasing circuit (505) tracks the supply voltage Vbatt. According to an exemplary embodiment of the present disclosure, the biasing voltage vg102 tracks the supply voltage Vbatt within a constant voltage, $V_K$, whose level is independent of the level of the supply voltage Vbatt, as provided by the equation vg102=Vbatt−$V_K$. A person skilled in the art will know of a variety of ways to generate such constant voltage $V_K$ and therefore, based on the present disclosure, will be able to implement various design examples of the biasing circuit (505). According to one exemplary embodiment of the present disclosure, the constant voltage $V_K$ can be based on a reference voltage, Vref, which is stable over the supply voltage Vbatt variation and temperature variation. According to a further embodiment of the present disclosure, a relationship between the gate voltage vg102 and such reference voltage, Vref, can be provided by the equation: vg102=Vbatt−k*Vref.

With further reference to the biasing circuit (505) of FIG. 5, according to an embodiment of the present disclosure the constant voltage $V_K$=k*Vref can be based on a desired voltage division of the supply voltage Vbatt across the pass devices (e.g. 101, 102) when the supply voltage is at its high voltage value (e.g. 4.6 V). In the exemplary case of two pass devices, (e.g. 101, 102) shown in FIG. 5, the constant voltage $V_K$ can be set to Vbatt$_H$/2, where Vbatt$_H$ is the high (maximum) voltage value (e.g. 4.6 V) of the supply voltage Vbatt, so as to equally divide the supply voltage across the two pass devices (101, 102) when the supply voltage is at its high voltage value. As the supply voltage decreases, the biasing of the gate of the second pass device (102) remains constant since it is kept at a constant voltage offset from the supply voltage, Vbatt, and therefore $R_{ON}$ of the second device (102) is maintained at a low resistance value.

Figure 6:
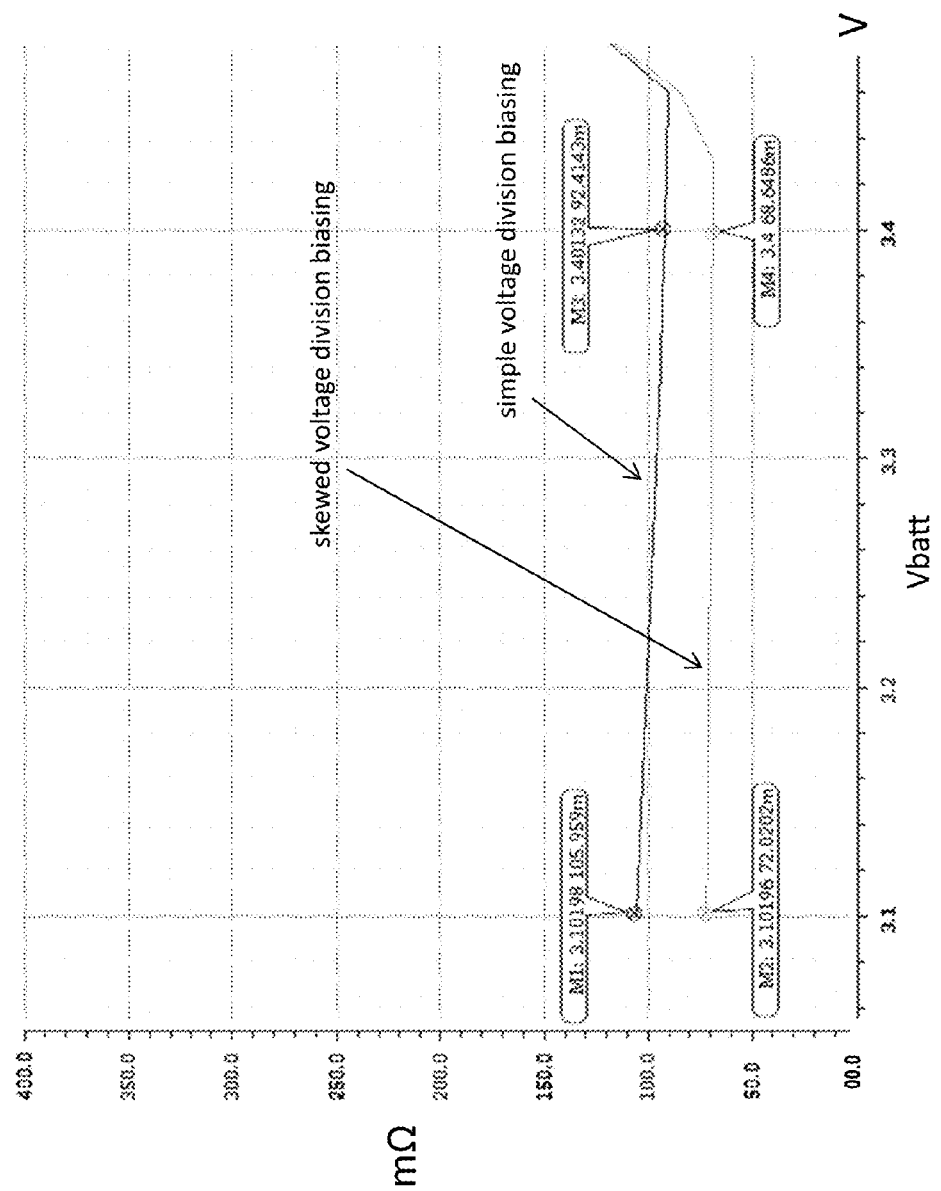
FIG. 6 shows graphs representing simulated values of the combined $R_{ON}$ of the pass devices for a case of a biasing circuit for equal voltage division across the pass devices and a case of the biasing circuit for the skewed voltage division across the pass devices.

FIG. 6 shows graphs of simulated values of the $R_{ON}$ for the combined pass devices (101, 102) for a case of the simple biasing circuit discussed above (e.g. resistors as voltage divider network (R45, R47) of FIG. 4), and for a case of a biasing circuit (505) represented in FIG. 5, and per the implementation of such biasing circuit depicted in FIGS. 8 and 9 later described. As can be seen in the graph of FIG. 6, for the low voltage values in the range of [3.10 V, 3.43 V] of the supply voltage Vbatt, the total $R_{ON}$ of the combined pass devices (101, 102) is significantly lower (e.g. 30% lower at 3.1 V) in the case where biasing to the second pass device (102) is provided by the biasing circuit (505) according to the present disclosure. As noted above, such biasing circuit (505) keeps a substantially constant voltage at the gate of the second pass device (102) with reference to the supply voltage Vbatt. Furthermore, it can be seen that the combined $R_{ON}$ for the biasing according to the present disclosure varies very little over the range [3.10 V, 3.43 V] when compared to the simple resistor-based voltage division biasing over the same range. As noted above, this is due to the substantially constant biasing of the second pass device (102) with respect to the supply voltage Vbatt over the noted voltage range provided by the biasing circuit (505) according to the present disclosure.

Figure 7A:
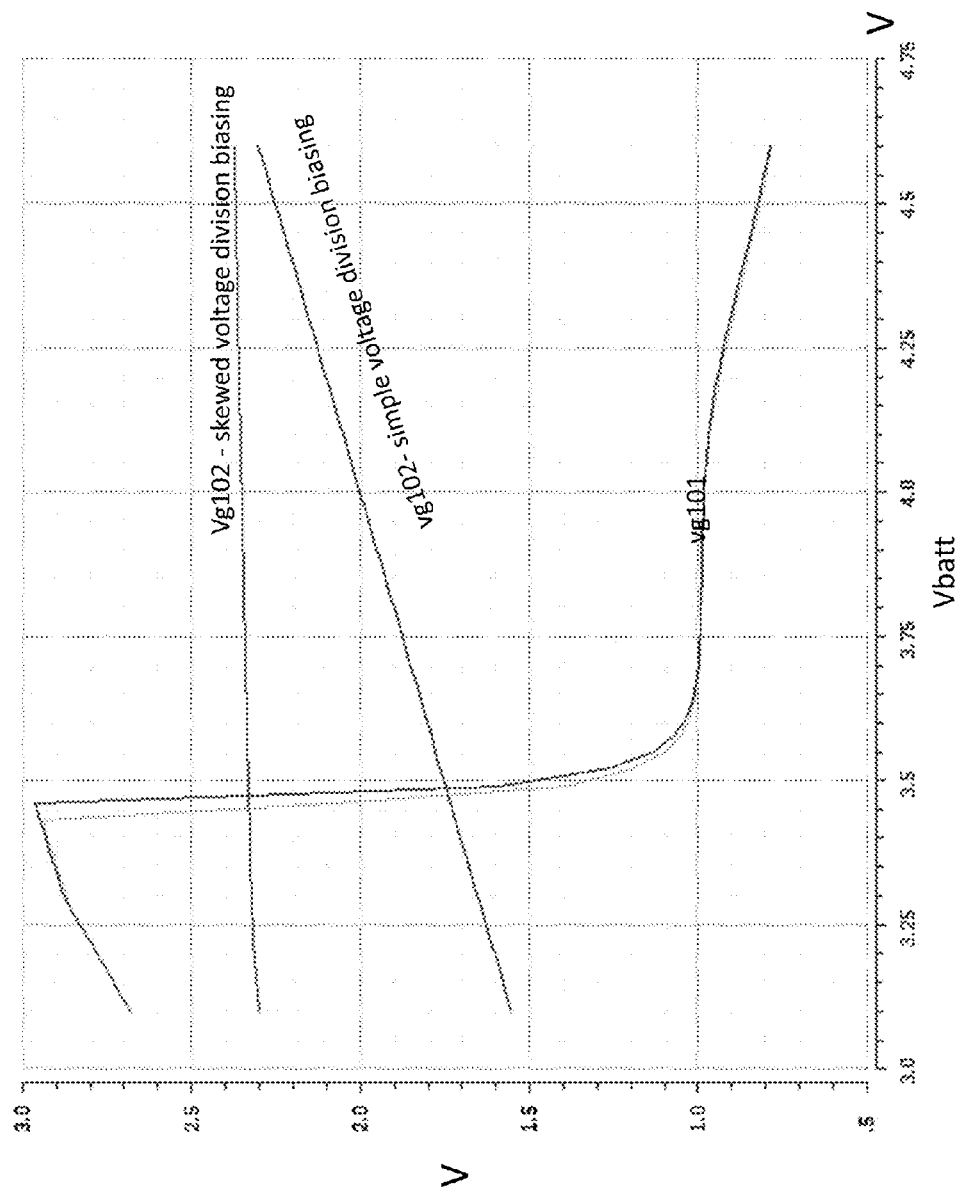
FIG. 7A shows graphs representing simulated signal values for the gate bias voltages of the pass devices for a case of a biasing circuit for equal voltage division across the pass devices and a case of the biasing circuit for the skewed voltage division across the pass devices.
Figure 8:
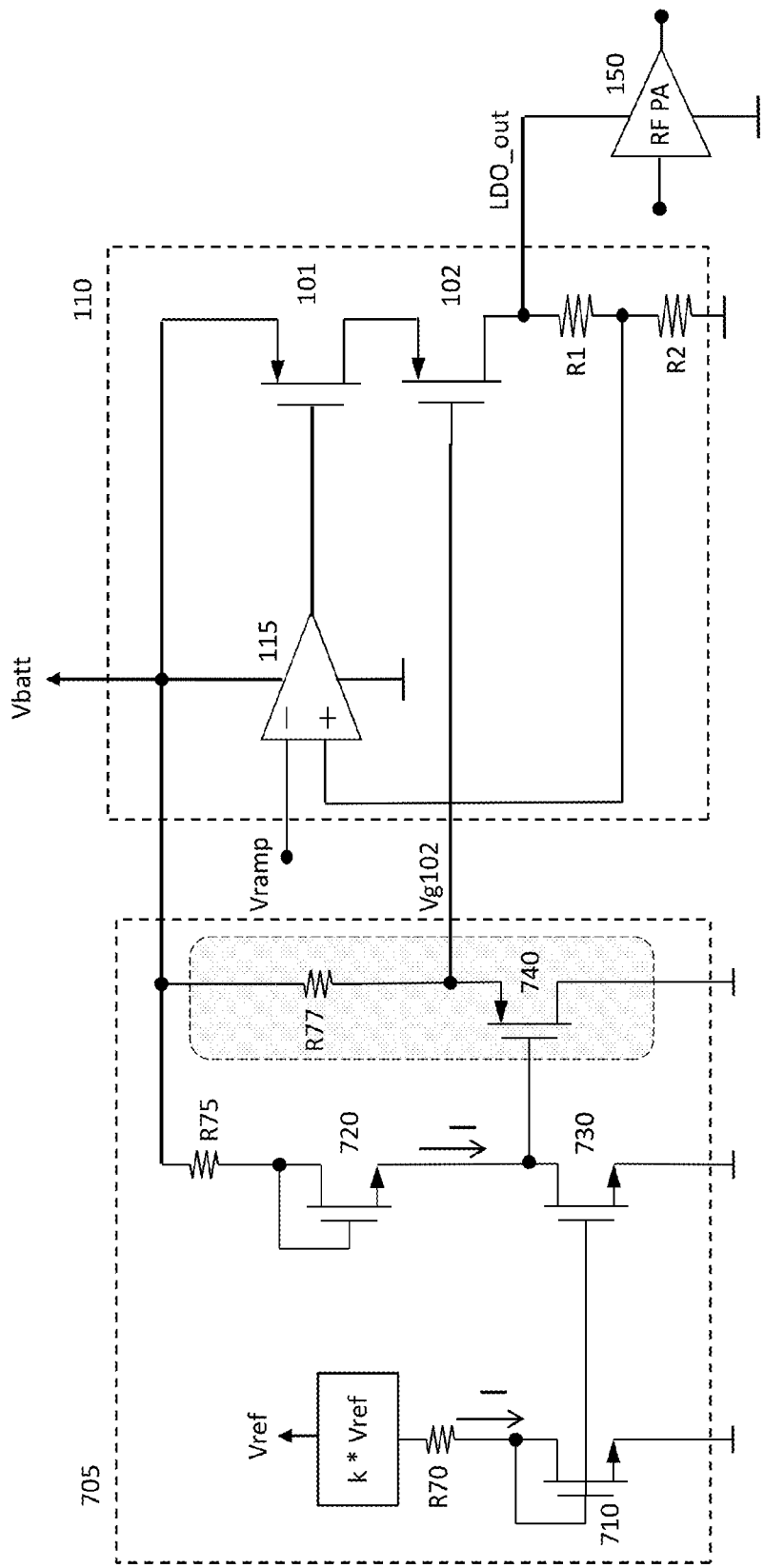
FIG. 8 shows a more detailed schematic representation of a biasing circuit according to an embodiment of the present disclosure.
Figure 9:
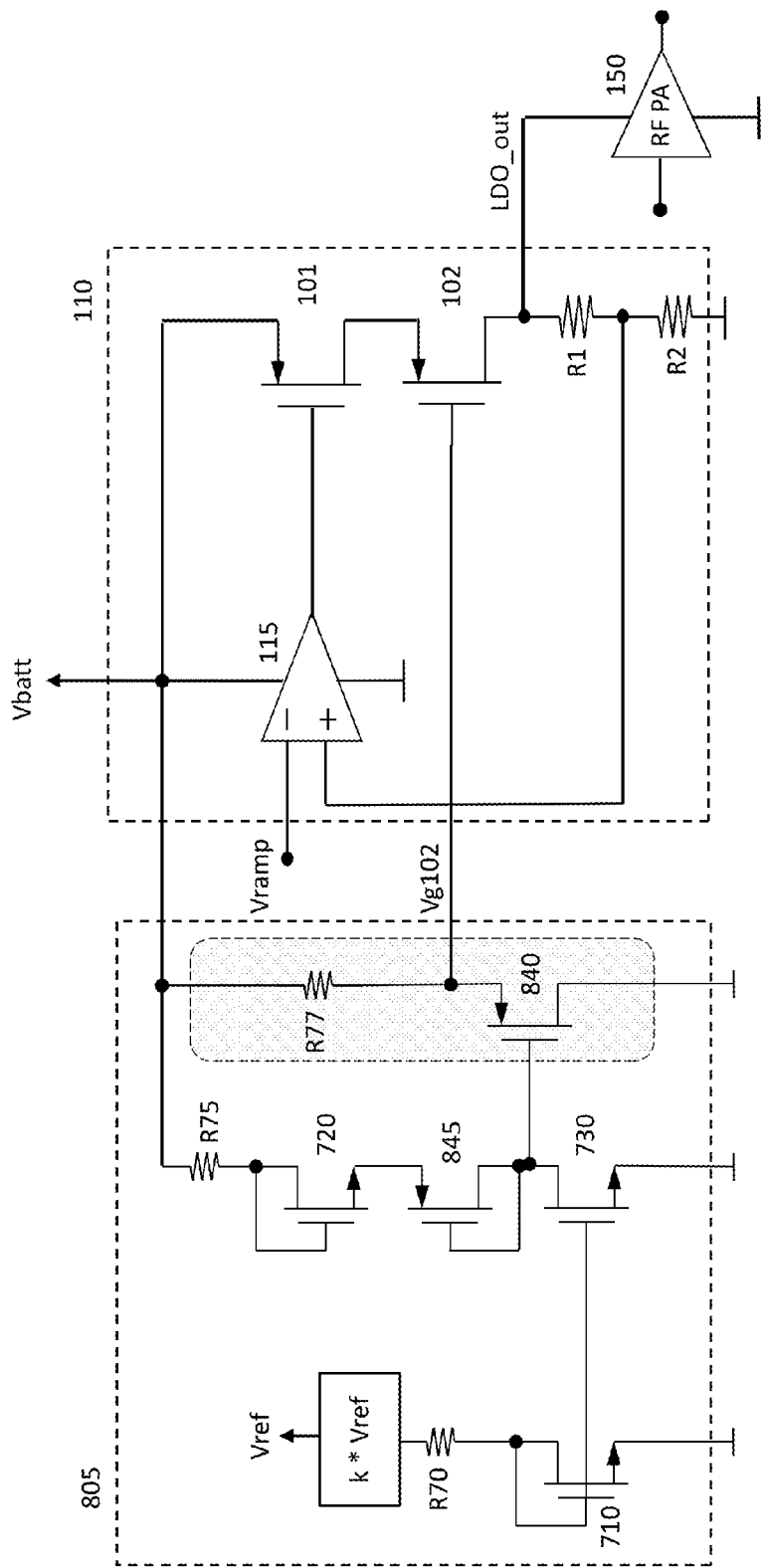
FIG. 9 shows a more detailed schematic representation of another biasing circuit according to an embodiment of the present disclosure.

FIG. 7A shows graphs of simulated signal values for the gate bias voltages (vg101, vg102) of the pass devices (101, 102) referenced to the supply voltage Vbatt for the cases of the simple biasing circuit (e.g. 405 of FIG. 4) and the skewed voltage division biasing circuit (505) according to the present disclosure shown in FIG. 5 (per implementation of FIGS. 8 and 9). As can be seen in such graphs, vg101 provided by the amplifier (115) to the top pass device (101) remains substantially the same for the two cases, with a slight deviation during the transition from the overdrive mode (pass devices operate in the triode region) to the normal regulation mode (pass devices operate in the saturation region) mainly due to the difference in $R_{ON}$ of the second pass device between the two cases and its affect over the feedback voltage to the amplifier (115). Additionally, when comparing the gate bias voltage vg102 to the second pass device, it can be seen that while such biasing voltage remains substantially constant (within 100 mV) with respect to the supply voltage throughout the entire voltage range of the supply voltage [3.1 V, 4.6 V] for the case of the skewed voltage division biasing circuit (505), it linearly varies with respect to the supply voltage for the case of the simple biasing circuit (e.g. 405 of FIG. 4). A person skilled in the art would understand that driving the transistors in the stack to their respective triode regions of operation as a consequence of a decreasing supply voltage Vbatt, includes driving the cascoded transistor (102) to its triode region of operation first, and driving the input transistor (101) to its triode region of operation last. When the supply voltage, Vbatt, is higher than the sum, S, of the output voltage of the stack (i.e. LDO_out) and the combined saturation voltage (Vdsat101+Vdsat102) of the transistors (101, 102) of the stack, then both transistors of the stack operate in their respective saturation regions of operation. On the other hand, when the supply voltage, Vbatt, decreases and becomes lower than the sum S, then transistor (102) switches operation to its triode regions of operation first, and with a further decreasing of the supply voltage, Vbatt, the input transistor (101) switches operation to its triode region of operation last. Similarly, as the supply voltage, Vbatt, increases from a low value, where all the transistors of the stack operate in their respective triode regions of operation, the input transistor (101) first switches operation to its saturation region of operation, and the cascoded transistor (102) switches operation to its triode region of operation when the supply voltage, Vbatt, is further increased to reach the sum S. A person skilled in the art would also know that the Vdsat of a transistor refers to a specific voltage drop across a drain and source of the transistor that denotes the voltage below which the transistor would starts entering its triode region of operation. The Vdsat voltage of a MOS transistor is well defined by the "knee" in the drain-source current Ids versus the drain-source voltage Vds curve of the MOS transistor.

Figure 7B:
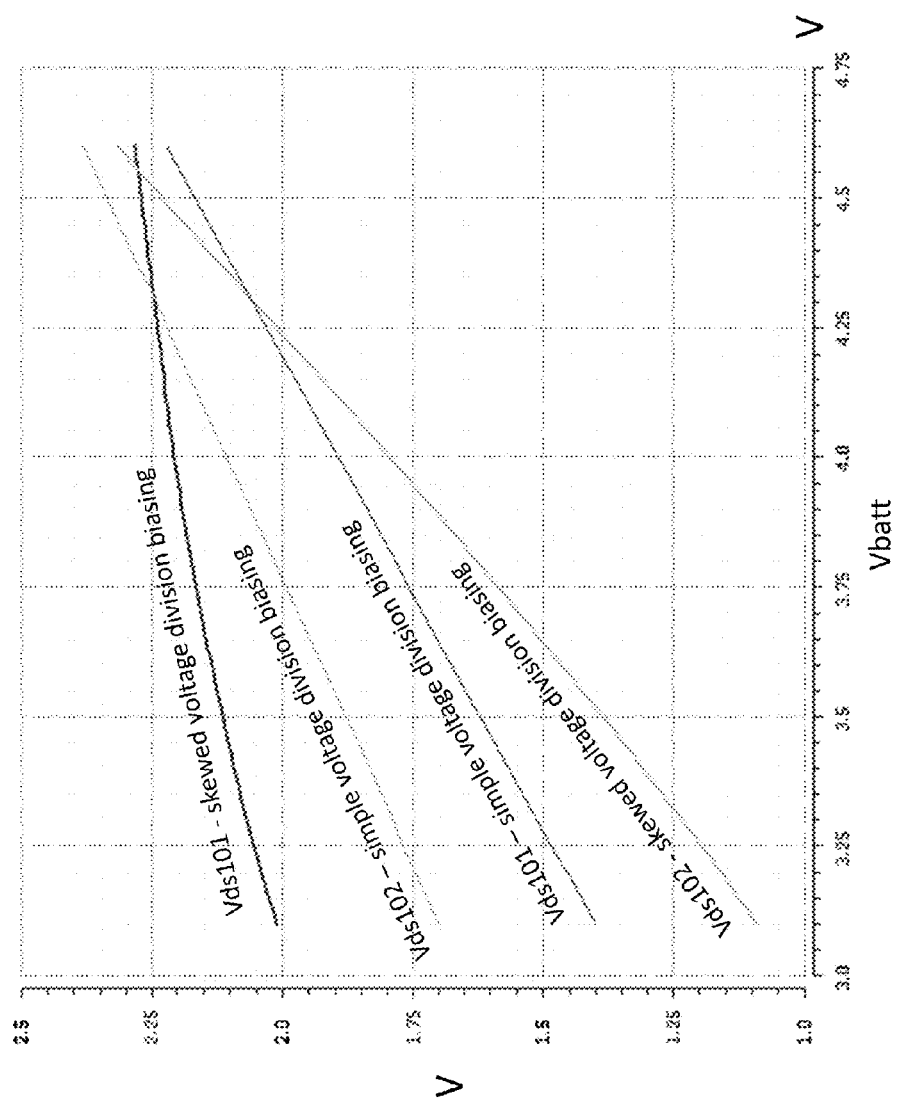
FIG. 7B shows graphs representing simulated signal values for the drain to source voltages of the pass devices for a case of a biasing circuit for equal voltage division across the pass devices and a case of the biasing circuit for the skewed voltage division across the pass devices.

FIG. 7B shows graphs of simulated signal values for the drain to source (Vds101, Vds102) voltages of the pass devices (101, 102) for the cases of the simple biasing circuit (e.g. 405 of FIG. 4) and the skewed voltage division biasing circuit (505) according to the present disclosure shown in FIG. 5 (per implementation of FIGS. 8 and 9). As can be seen in such graphs, for both cases and throughout the entire voltage range of the supply voltage [3.1 V, 4.6 V], voltages across the pass transistor (101-102) are kept within a safe operating range (e.g. 2.5 V), albeit using differing divisions of the supply voltage across the pass transistors. Additionally, as the supply voltage increases to its high level (e.g. 4.6 V), in both biasing cases, Vds101 and Vds02 converge to a close to equal voltage division of the supply voltage.

According to an exemplary embodiment of the present disclosure, a circuital representation of the biasing circuit (705) based on the biasing circuit (505) discussed above is provided in FIG. 8. The stable reference voltage Vref is multiplied by a constant k so as to obtain a voltage substantially equal to the high voltage level $Vbatt_H/2$ of the supply voltage Vbatt. According to a non-limiting exemplary embodiment of the present disclosure, $Vbatt_H$ can be equal to 4.6 V, Vref can be equal to 4.6 V, and the constant k can be equal to 0.5. When the voltage Vref*k is fed to the circuit comprising the diode connected transistor (710) and resistor (R70), a current I is generated through such circuit which is proportional to the fed voltage. The current I is then mirrored through the circuit (720, 730, R75), where the resistance of resistor (R75) is equal to the resistance of the resistor (R70) and the diode-connected transistor (720) is of a same type and characteristics as the diode-connected transistor (710). As a result, a voltage drop across the combination of (R75, 720) is equal to the voltage drop across the combination of (R70, 710), and therefore, the voltage at the drain node of the transistor (730) is equal to Vbatt–k*Vref. The voltage at the drain node of the transistor (730) is further buffered via an exemplary PMOS source follower circuit (740, R77), where the PMOS transistor (740) can be an intrinsic PMOS transistor with a threshold voltage (Vth) substantially equal to zero, such as the voltage vg102 at the source node of the PMOS transistor (740) remains substantially equal to the voltage at the drain of the transistor (730). As a result, vg102=Vbatt–k*Vref. The PMOS source follower circuit (740, R77) can properly and timely set the voltage at the gate of the second pass transistor (102) by providing a higher current capability (sink and source). According to an embodiment of the present disclosure, the size of the PMOS transistor (740) can be set to be large enough to sink current from the gate of the second pass device (102) fast enough so as to timely set the voltage at the gate of the second pass device (102). Additionally, the size of the resistor R77 can be set to be small enough to source current to the gate of the second pass device (102) with a small enough voltage drop across the resistor, while maintaining a desired time constant for the charging of the voltage at the gate of the second pass device (102). As noted above, the exemplary biasing circuit (705) of FIG. 8 is configured to track the supply voltage Vbatt to the stacked pass devices (101, 102), and to generate a biasing voltage for the second pass device (102) that maintains a low $R_{ON}$ of the second device while providing a safe operation of the pass devices (101, 102).

With further reference to FIG. 8, as discussed in prior sections of the present disclosure, the second pass device (102) is part of the closed loop control circuit that is used to generate the output voltage LDO_out. Therefore, for proper operation of the closed loop control circuit, it can be desirable that the biasing circuit (705) be able to set the proper gate voltage within a response time equal to or faster than the response time of the closed loop control circuit. Such response time can be based, for example, according to the slew rate of the burst output voltage discussed above in relation to FIG. 2. As noted above, this can be accomplished through known in the art design techniques, such as selection of the resistor value of (R77) and the size of the PMOS transistor (740) in view of the size of the pass device (102). It should be noted that the exemplary PMOS buffer circuit (740, R77) depicted in FIG. 8 should not be considered as limiting the scope of the invention, as a person skilled in the art will know of alternative circuit designs suited for buffering the voltage at the node of the transistor (730) with minimum impact on such voltage and drive the gate of the pass transistor at a desired speed.

According to further embodiments of the present disclosure, it may be desirable to reduce sensitivity to temperature of the gate biasing voltage to the second pass device (102) of FIG. 8. A person skilled in the art is well aware of possible variation with respect to temperature of the threshold voltage (Vth) of an intrinsic bipolar junction transistor, such as the transistor (740) used in the biasing circuit (705) depicted in FIG. 8. In turn, a variation of the threshold voltage (Vth) can induce a similar variation of the gate voltage vg102 provided to the gate of the second pass device (102). It follows that according to an embodiment of the present disclosure, such variation is cancelled by using a transistor (e.g. 845 of FIG. 9) in the mirroring circuit (720, 730, R75) that has a same variation with respect to temperature as the PMOS transistor used in the follower circuit (740, R77), as shown in FIG. 9.

With reference to FIG. 9, the biasing circuit (805) cancels a temperature effect of the follower transistor (840) over the generated gate voltage vg102 by inserting a transistor (845) of same characteristics (but can have a different size) in the mirroring circuit (730, 720, R75). The transistor (845) being connected as a diode, a voltage drop across its source and gate (common with the drain) is added to the voltage at the drain node of the transistor (730), and then subtracted by the same amount by the voltage drop across the source and gate of the follower transistor (840). As the two transistors have the same characteristics, their respective source to gate voltages track one another with respect to temperature variation with a net effect of cancelling one another in the overall biasing circuit (805) according to the present disclosure.

As previously noted in the present disclosure, the number of stacked pass devices arranged in a cascode configuration can be a function of a high voltage subjected to the stack and a withstand voltage of each pass device. In a typical case where the pass devices have a same withstand voltage, the minimum number of required pass devices can be obtained by dividing the high voltage subjected to the stack by the withstand voltage. The exemplary biasing circuits for biasing the cascodes transistors (transistors not driven by the amplifier (115)) discussed above show an exemplary stack of two transistors, where the cascoded transistor (102) is provided with a gate biasing circuit adapted to maintain operation of the transistors of the stack within their safe operation (e.g. no voltage greater than the withstand voltage applied across any two terminals of each transistor). The biasing circuit (505) according to the present disclosure shown in FIG. 5, with further implementation details in FIGS. 8 and 9, can be expanded for biasing a cascoded stack comprising more than two transistors, as depicted in FIG. 10.

Figure 10:
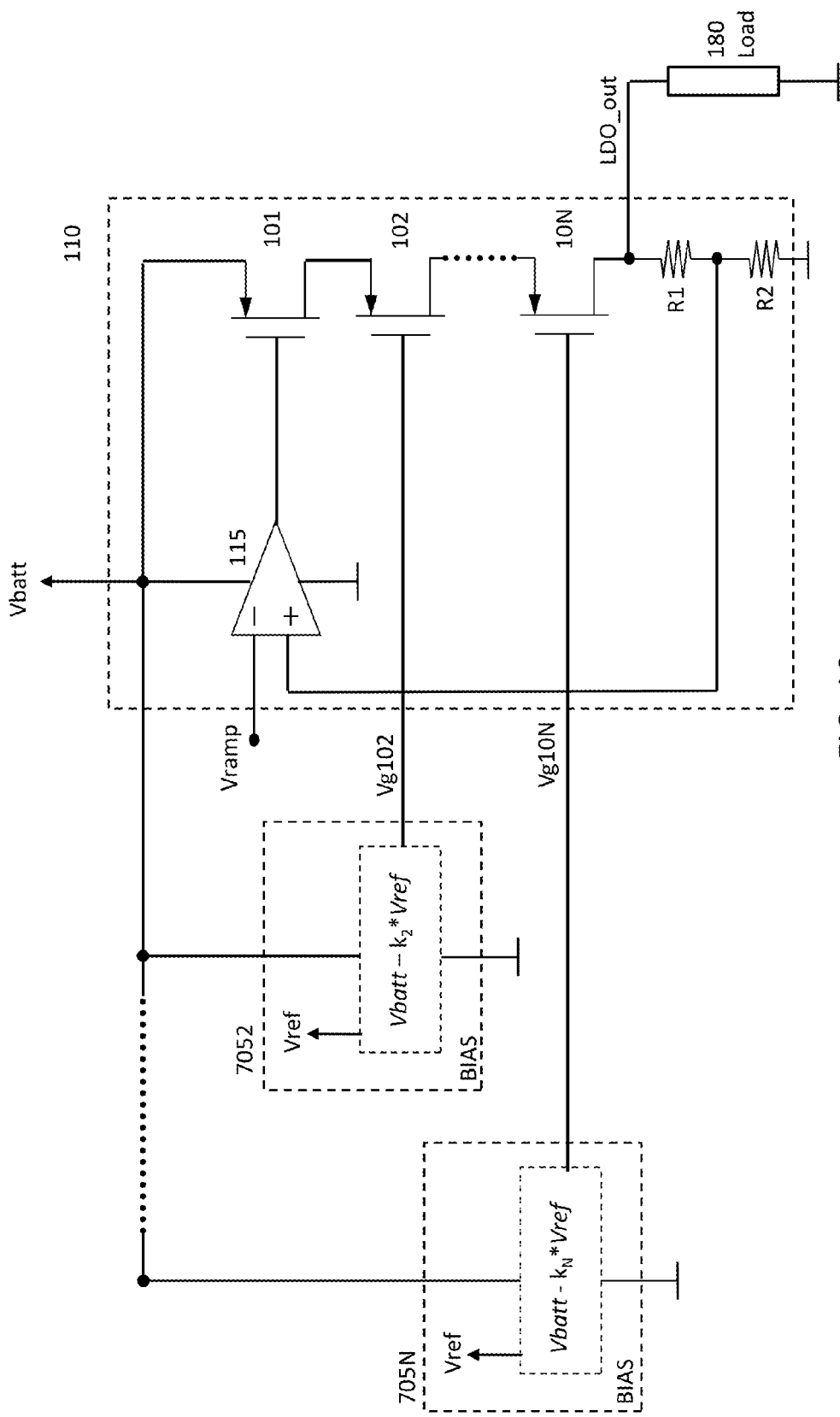
FIG. 10 is a simplified schematic representation similar to the one of FIG. 5, where a plurality of biasing circuits according to the embodiment of the present disclosure are used to provide a plurality of biasing voltages each with a constant offset voltage with respect to the varying supply voltage.

According to one exemplary embodiment of the present disclosure as depicted in FIG. 10, a cascoded stack of transistors (101, 102, . . . , 10N) can be used as the pass devices to provide a high power (voltage and current) to a load (180). As discussed above, the load (180) can be a load corresponding to an RF power amplifier (e.g. 150 of FIGS. 1, 5, 8, 9). The cascoded stack of transistors can comprise a plurality of transistors (101, 102, . . . , 10N) where each of the cascoded transistors (102, 103, . . . , 10N) is biased by a biasing circuit (7052, 7053, . . . , 705N) similar to the biasing circuit (505), (705) or (805) discussed above with reference to FIGS. 5, 8 and 9. In such case, the desired voltage division of the supply voltage at its high voltage level (Vbatt$_H$) is divided by the number N of the transistor in the cascoded stack of transistors to establish an incremental offset voltage:

$$V\text{inc}=V\text{batt}_H/N,$$

and each biasing circuit (7052, 7053, . . . , 705N) generates a corresponding gate biasing voltage (Vg102, Vg103, Vg10N) with a constant offset with respect to the supply voltage based on the incremental offset voltage, such as:

$$Vg102=V\text{batt}-k_2*V\text{ref}=V\text{batt}-1*V\text{inc};$$

$$Vg103=V\text{batt}-k_3*V\text{ref}=V\text{batt}-2*V\text{inc}; \text{ and}$$

$$Vg10N=V\text{batt}-k_N*V\text{ref}=V\text{batt}-(N-1)*V\text{inc}.$$

Based on the presented formulae here above, a person skilled in the art would notice that such general implementation according to the present disclosure for generating the gate biasing voltages allows for negative voltages at the gates of the cascoded transistors (102, . . . , 10N). For example, for Vbatt=10 V and N=5, Vg105=10−(5−1)*2=2 V, and for Vbatt=5 V and N=5, Vg105=5−(5−1)*2=−3 V. Such negative gate biasing voltages may further improve (i.e. reduce) the R$_{ON}$ of such cascoded transistors at low Vbatt voltages. A practical circuit with only positive voltage generation may limit the gate voltages Vg102 to Vg10N to positive values only, and therefore limit a low resistance value of the R$_{ON}$ of the cascaded transistors (102, . . . , 10N).

With further reference to FIG. 10, in an alternative embodiment according to the present disclosure for biasing a cascoded stack of N transistors, where N>2, one biasing circuit similar to the biasing circuit (705) or (805) can be used to track the supply voltage within an offset voltage, and other circuits can be used to further generate the appropriate gate biasing voltages based on the tracked voltage generated by the one biasing circuit. A person skilled in the art will know how to implement the other circuits based on the output of the one biasing circuit.

Figure 11:
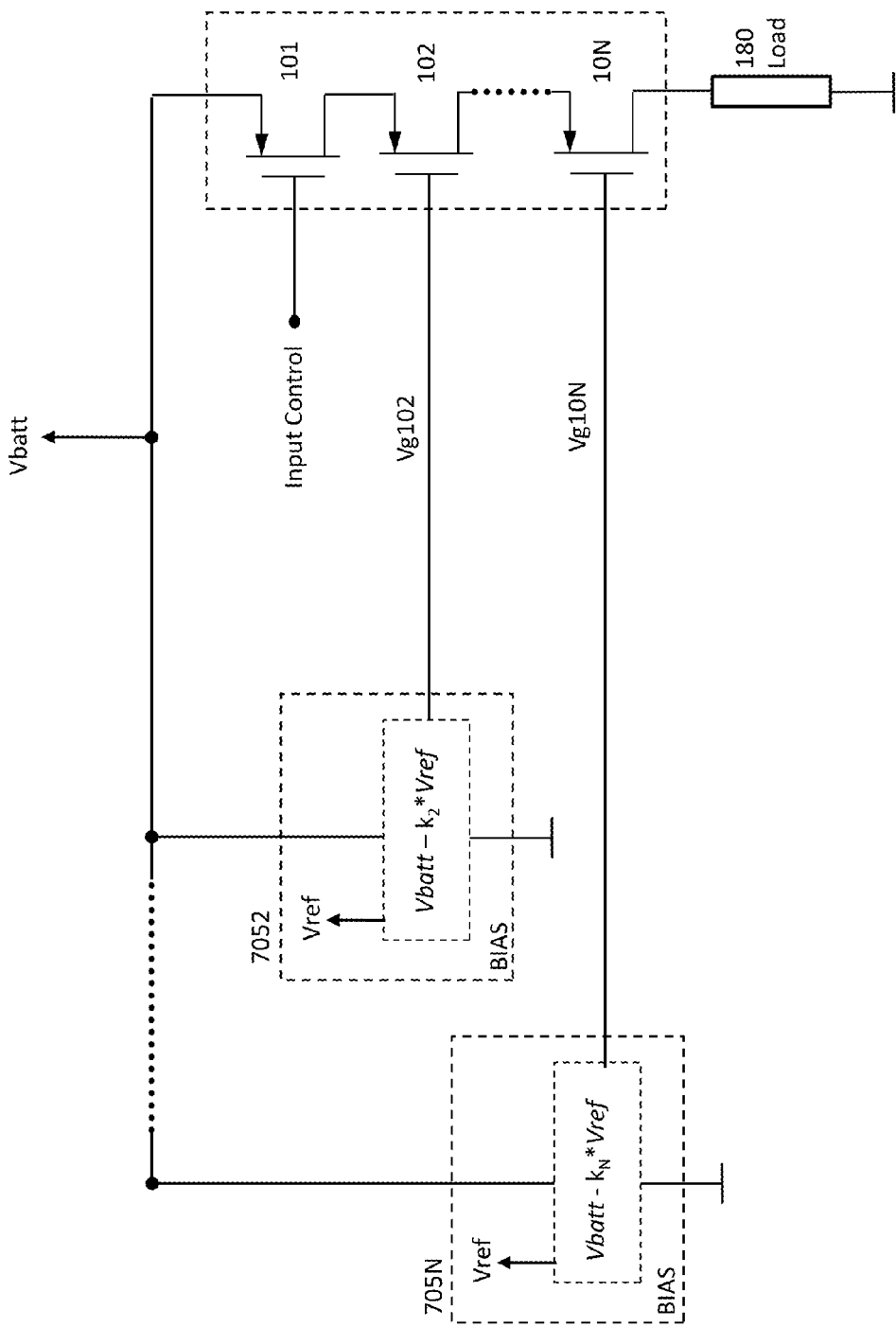
FIG. 11 shows a simplified schematic of a stacked transistor device whose cascoded transistors are each provided with a biasing voltage according to the present disclosure.

Although the biasing techniques according to the present teachings described above are exemplified in a cascoded stack of transistors used as pass devices in an LDO application, a person skilled in the art readily understands that such teachings can be equally applied to the biasing of any cascoded stack of transistors (e.g. 101-10N of FIG. 11) as depicted in FIG. 11. With further reference to FIG. 11, the cascoded stack of transistors (101-10N) can be used in, for example, a high power application, where the input transistor of the stack (e.g. 101) is driven into its triode region of operation by an input control signal. Accordingly, while the input transistor (101) is driven into its triode region of operation, causing the cascoded transistors (e.g. 102, . . . , 10N of FIG. 11; transistors of the cascoded stack different from the input transistor) to also operate in their respective triode region of operation, the R$_{ON}$ of the cascoded transistors can be maintained to a lower value by biasing the gate of the cascoded transistors based on a voltage that tracks a variation of the supply voltage provided to the cascoded stack of transistors, as provided by the biasing circuits (7052-705N). Applications where a cascoded stack of transistors are used as an output current driver can range from DC-DC converters or other applications where the input control signal can be generated by a switching amplifier (not shown in FIG. 11). A person skilled in the art would understand that driving the transistors in the stack to their respective triode regions of operation as a consequence of a decreasing supply voltage Vbatt, includes driving the cascoded transistors (102, . . . , 10N) to their respective triode regions of operation first, and driving the input transistor (101) to its triode region of operation last. Similar to the case of two stacked transistors discussed above, when the supply voltage, Vbatt, is higher than the sum, S, of the output voltage of the stack (i.e. drain of transistor 10N) and the combined saturation voltage (Vdsat101+Vdsat102+ . . . +Vdsat10N) of the transistors (101, 102, . . . , 10N) of the stack, then all the transistors of the stack operate in their respective saturation regions of operation. On the other hand, when the supply voltage, Vbatt, is lower than the sum S, then some of the transistors of the stack switch operation to their respective triode regions of operation, and an increasing number of transistors switch operation as the supply voltage is further decreased, with the input transistor (101) switching operation to its triode region of operation last. Similarly, as the supply voltage increases from a low value, where all the transistors of the stack operate in their respective triode regions of operation, the input transistor first switches operation to its saturation region of operation, and gradually the cascoded transistors switch operation with an increasing supply voltage. Once the supply voltage reaches the sum S, then all the transistors of the stack operate in their respective saturation regions of operation.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), siliconon-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

The invention claimed is:

1. A circuital arrangement for biasing a cascoded transistor of a stack of transistors arranged in a cascode configuration, the circuital arrangement comprising:
   a stack of at least two transistors arranged in a cascode configuration, comprising an input transistor and a first cascoded transistor; and
   a biasing circuit configured to provide a first bias voltage to the first cascoded transistor,
   wherein:
   a supply voltage to the stack is a varying supply voltage, and
   the first bias voltage is at a substantially constant offset voltage with respect to the varying supply voltage.

2. The circuital arrangement according to claim 1, wherein:
   the first bias voltage increases with an increase of the varying supply voltage, and
   the first bias voltage is adapted to maintain operation of the at least two transistors of the stack within a safe region of operation, the safe region of operation being defined by a withstand voltage of each of the at least two transistors of the stack.

3. The circuital arrangement according to claim 1, wherein:
   the first bias voltage is adapted to provide a substantially equal voltage division of the supply voltage across the stack of at least two transistors when the supply voltage is at a high voltage, and
   the first bias voltage is adapted to provide a skewed voltage division of the supply voltage across the stack of at least two transistors when the supply voltage is lower than the high voltage.

4. The circuital arrangement according to claim 3, wherein:
   a drive voltage to the input transistor is adapted to drive the input transistor to operate in its saturation region of operation when the supply voltage is higher than a sum of an output voltage from the stack and a combined saturation voltage of the at least two transistors of the stack, and
   the drive voltage to the input transistor is adapted to drive the input transistor to operate in its triode or saturation region of operation when the supply voltage is lower than the sum of the output voltage from the stack and the combined saturation voltage of the at least two transistors of the stack.

5. The circuital arrangement according to claim 4, wherein:
   when the input transistor operates in its triode region of operation, the first cascoded transistor also operates in its triode region of operation, and
   when the supply voltage is lower than the sum of the output voltage from the stack and the combined saturation voltage of the at least two transistors of the stack, the first bias voltage is adapted to maintain an ON resistance $R_{ON}$ of the first cascoded transistor at a substantially constant value throughout operation of the first cascoded transistor in its triode region of operation.

6. The circuital arrangement according to claim 1, wherein:
   the stack of at least two transistor comprises one or more additional cascoded transistors, and
   the biasing circuit is further configured to provide one or more additional bias voltages to the additional one or more cascoded transistors, the one or more additional bias voltages having each a substantially constant offset voltage with respect to the varying supply voltage.

7. The circuital arrangement according to claim 1, wherein the offset voltage is based on a reference voltage with respect to a ground potential that is independent from a variation of the supply voltage and is independent from a variation of temperature.

8. The circuital arrangement according to claim 1, wherein the biasing circuit is configured to translate the reference voltage with respect to the ground potential to the offset voltage with respect to the varying supply voltage.

9. The circuital arrangement according to claim 8, wherein the biasing circuit comprises a reference circuit that translates the reference voltage to a reference current corresponding to the offset voltage.

10. The circuital arrangement according to claim 9, wherein:
    the reference circuit comprises a resistor connected in series to a diode-connected transistor, and
    the reference current flows through the reference circuit to generate a voltage drop across the reference circuit equal to the offset voltage.

11. The circuital arrangement according to claim 10, wherein the biasing circuit further comprises a current mirroring circuit that mirrors the reference current, the current mirroring circuit comprising a circuit similar to the reference circuit to provide a voltage drop equal to the offset voltage with respect to the varying supply voltage at an output node of the current mirroring circuit.

12. The circuital arrangement according to claim 11, wherein the biasing circuit further comprises a buffering circuit configured to buffer the voltage at the output node of the current mirroring circuit to provide the first bias voltage.

13. The circuital arrangement according to claim 12, wherein the buffering circuit comprises a source follower circuit.

14. The circuital arrangement according to claim 13, wherein the buffering circuit comprises:
   a transistor whose gate terminal is connected to the output node of the current mirroring circuit and drain terminal is connected to the ground potential; and
   a resistor connected between a source terminal of the transistor and the supply voltage.

15. The circuital arrangement according to claim 14, wherein the transistor is an intrinsic PMOS transistor with a threshold voltage (Vth) substantially equal to zero.

16. The circuital arrangement according to claim 14, wherein:
   the transistor of the buffering circuit has a non-zero threshold voltage (Vth),
   the reference circuit comprises an additional transistor connected as a diode with characteristics similar to characteristics of the transistor of the buffering circuit, and
   the additional transistor provides an additional voltage drop at the output node of the current mirroring circuit to cancel a voltage drop associated to the non-zero threshold voltage of the transistor of the buffering circuit.

17. The circuital arrangement according to claim 14, wherein:
   the stack operates as a pass device under control of a control voltage provided to the input transistor, and
   a size of the resistor of the buffering circuit and a size of the transistor of the buffering circuit are selected so as to satisfy a charging and discharging speed of the first bias voltage provided to the first cascoded transistor according to a slew rate of the control voltage.

18. The circuit arrangement according to claim 17, wherein:
   the stack is a pass device of a low drop out regulator (LDO) that provides a conduction path between a source of the input transistor of the stack connected to the varying supply voltage, and a drain of a last cascoded transistor of the at least two transistors of the stack connected to a load, and
   responsive to the control voltage provided to the input transistor, the at least two transistors of the stack operate in:
      i) a saturation region of operation when the supply voltage is higher than a sum of an output voltage of the LDO and a combined saturation voltage of the at least two transistors of the stack; and
      ii) a triode region of operation when the supply voltage is lower than the sum of the output voltage of the LDO and the combined saturation voltage of the at least two transistors of the stack.

19. The circuit arrangement according to claim 18, wherein the first bias voltage is adapted to maintain an ON resistance $R_{ON}$ of the first cascoded transistor at a substantially constant value throughout operation of the first cascoded transistor in its triode region of operation.

20. A method for biasing a stack of transistors, the method comprising:
   providing a stack of at least two transistors arranged in a cascode configuration, the stack comprising an input transistor and one or more cascoded transistors;
   supplying a supply voltage across the stack;
   biasing the one or more cascoded transistors with respective one or more biasing voltages, the respective one or more biasing voltages having each a substantially constant offset voltage with respect to the supply voltage;
   providing a control voltage to the input transistor;
   based on the providing of the control voltage, driving the input transistor in its triode region of operation;
   based on the driving, driving the one or more cascoded transistors in their respective triode regions of operation;
   based on the biasing, obtaining an ON resistance $R_{ON}$ for each of the one or more cascoded transistors;
   varying the supply voltage; and
   based on the varying and the biasing, maintaining the ON resistance $R_{ON}$ of the one or more cascoded transistors.

21. The method according to claim 20, wherein the varying further comprises:
   increasing the supply voltage to a high value voltage;
   based on the increasing and the biasing, providing a substantially equal voltage division of the supply voltage across the stack of at least two transistors;
   decreasing the supply voltage below the high value voltage; and
   based on the decreasing and the biasing, providing a skewed voltage division of the supply voltage across the stack of at least two transistors.

22. The method according to claim 20, wherein the substantially equal voltage division and the skewed voltage division provide an operation of each of the at least two transistors of the stack within a safe region of operation, the safe region of operation being defined by a withstand voltage of each of the at least two transistors of the stack.

23. The method according to claim 20, wherein the biasing comprises generating the one or more biasing control voltages with positive and negative voltage values responsive to the varying of the supply voltage.

24. A method for biasing a cascoded stack of transistors, the method comprising:
   applying a varying supply voltage across the stack;
   when the varying supply voltage is at a high voltage, biasing cascoded transistors of the stack for a substantially equal voltage division of the high voltage across all transistors of the stack; and
   when the varying supply voltage is below the high voltage, biasing the cascoded transistors for a skewed voltage division of the varying supply voltage across the all transistors of the stack.

25. The method according to claim 24, wherein the biasing of the cascoded transistors for the skewed voltage division comprises providing a gate biasing voltage to each transistor of the cascoded transistors that is at a substantially constant offset voltage with respect to the varying supply voltage.

* * * * *